(12) United States Patent
Shifley

(10) Patent No.: US 9,302,464 B2
(45) Date of Patent: Apr. 5, 2016

(54) INKING SYSTEM FOR FLEXOGRAPHIC PRINTING

(71) Applicant: James Douglas Shifley, Spencerport, NY (US)

(72) Inventor: James Douglas Shifley, Spencerport, NY (US)

(73) Assignee: EASTMAN KODAK COMPANY, Rochester, NY (US)

(*) Notice: Subject to any disclaimer, the term of this patent is extended or adjusted under 35 U.S.C. 154(b) by 63 days.

(21) Appl. No.: 14/146,867

(22) Filed: Jan. 3, 2014

(65) Prior Publication Data

US 2015/0191006 A1    Jul. 9, 2015

(51) Int. Cl.

| | |
|---|---|
| *B41F 31/06* | (2006.01) |
| *B41F 5/24* | (2006.01) |
| *B41F 31/13* | (2006.01) |
| *B41F 31/04* | (2006.01) |
| *B41F 31/20* | (2006.01) |
| *H05K 1/03* | (2006.01) |
| *H05K 3/12* | (2006.01) |

(52) U.S. Cl.
CPC . *B41F 31/13* (2013.01); *B41F 5/24* (2013.01); *B41F 31/04* (2013.01); *B41F 31/06* (2013.01); *B41F 31/20* (2013.01); *H05K 1/0393* (2013.01); *H05K 3/1275* (2013.01); *H05K 2203/1545* (2013.01); *Y10T 428/24802* (2015.01)

(58) Field of Classification Search
CPC .......... B41F 31/06; B41F 31/08; B41F 31/02; B41F 5/24
See application file for complete search history.

(56) References Cited

U.S. PATENT DOCUMENTS

| | | | | |
|---|---|---|---|---|
| 3,180,257 A | * | 4/1965 | Shields | B41F 31/00 101/154 |
| 3,613,578 A | * | 10/1971 | Heurich | B41F 5/24 101/352.13 |
| 4,186,661 A | | 2/1980 | Vieau | |
| 4,497,250 A | * | 2/1985 | Dressler | B41F 31/02 101/350.5 |
| 5,088,407 A | * | 2/1992 | Helm | B41F 5/24 101/352.01 |
| 6,666,137 B2 | * | 12/2003 | Goldburt | B41F 31/06 101/326 |
| 7,487,724 B1 | | 2/2009 | Evans et al. | |
| 8,240,250 B2 | * | 8/2012 | Boettcher | B41F 9/1036 101/350.1 |
| 2014/0242294 A1 | * | 8/2014 | Petcavich | H05K 3/4664 427/534 |

FOREIGN PATENT DOCUMENTS

| | | |
|---|---|---|
| DE | 2 321 377 | 4/1974 |
| WO | 2013/063188 | 5/2013 |

* cited by examiner

*Primary Examiner* — Matthew G Marini
*Assistant Examiner* — Leo T Hinze
(74) *Attorney, Agent, or Firm* — Kevin E. Spaulding

(57) ABSTRACT

A flexographic printing system comprising a print module including a plate cylinder on which is mounted a flexographic printing plate, an impression cylinder, an ink pan containing an ink, and an anilox roller for transferring the ink to the flexographic printing plate. A fountain roller mounted to the ink pan is at least partially immersed in the ink in the ink pan and transfers the ink to the anilox roller. A doctor blade mounted to the ink pan and is on a side of the anilox roller proximate to the impression cylinder removes excess amounts of the ink from the patterned surface of the first anilox roller before the ink is transferred to the flexographic printing plate.

12 Claims, 12 Drawing Sheets

INKING SYSTEM FOR FLEXOGRAPHIC PRINTING

FIELD OF THE INVENTION

This invention pertains to the field of flexographic printing, and more particularly to an inking system for providing ink to a flexographic printing plate.

BACKGROUND OF THE INVENTION

Flexography is a method of printing or pattern formation that is commonly used for high-volume printing runs. It is typically employed for printing on a variety of soft or easily deformed materials including, but not limited to, paper, paperboard stock, corrugated board, polymeric films, fabrics, metal foils, glass, glass-coated materials, flexible glass materials and laminates of multiple materials. Coarse surfaces and stretchable polymeric films are also economically printed using flexography.

Flexographic printing members are sometimes known as relief printing members, relief-containing printing plates, printing sleeves, or printing cylinders, and are provided with raised relief images onto which ink is applied for application to a printable material. While the raised relief images are inked, the recessed relief "floor" should remain free of ink.

Although flexographic printing has conventionally been used in the past for printing of images, more recent uses of flexographic printing have included functional printing of devices, such as touch screen sensor films, antennas, and other devices to be used in electronics or other industries. Such devices typically include electrically conductive patterns.

Touch screens are visual displays with areas that may be configured to detect both the presence and location of a touch by, for example, a finger, a hand or a stylus. Touch screens may be found in televisions, computers, computer peripherals, mobile computing devices, automobiles, appliances and game consoles, as well as in other industrial, commercial and household applications. A capacitive touch screen includes a substantially transparent substrate on which are patterned electrically conductive patterns that do not excessively impair the transparency—either because the conductors are made of a material, such as indium tin oxide, that is substantially transparent, or because the conductors are sufficiently narrow that the transparency is provided by the comparatively large open areas not containing conductors. As the human body is also an electrical conductor, touching the surface of the screen results in a distortion of the screen's electrostatic field, measurable as a change in capacitance.

Projected capacitive touch technology is a variant of capacitive touch technology. Projected capacitive touch screens are made up of a matrix of rows and columns of conductive material that form a grid. Voltage applied to this grid creates a uniform electrostatic field, which can be measured. When a conductive object, such as a finger, comes into contact, it distorts the local electrostatic field at that point. This is measurable as a change in capacitance. The capacitance can be changed and measured at every intersection point on the grid. Therefore, this system is able to accurately track touches. Projected capacitive touch screens can use either mutual capacitive sensors or self capacitive sensors. In mutual capacitive sensors, there is a capacitor at every intersection of each row and each column. A 16×14 array, for example, would have 224 independent capacitors. A voltage is applied to the rows or columns. Bringing a finger or conductive stylus close to the surface of the sensor changes the local electrostatic field which reduces the mutual capacitance. The capacitance change at every individual point on the grid can be measured to accurately determine the touch location by measuring the voltage in the other axis. Mutual capacitance allows multi-touch operation where multiple fingers, palms or styli can be accurately tracked at the same time.

Self-capacitance sensors can use the same x-y grid as mutual capacitance sensors, but the columns and rows operate independently. With self-capacitance, the capacitive load of a finger is measured on each column or row electrode by a current meter. This method produces a stronger signal than mutual capacitance, but it is unable to resolve accurately more than one finger, which results in "ghosting", or misplaced location sensing.

WO 2013/063188 by Petcavich et. al. discloses a method of manufacturing a capacitive touch sensor using a roll-to-roll process to print a conductive pattern on a flexible transparent dielectric substrate. A first conductor pattern is printed on a first side of the dielectric substrate using a first flexographic printing plate and is then cured. A second conductor pattern is printed on a second side of the dielectric substrate using a second flexographic printing plate and is then cured. In some embodiments the ink used to print the patterns includes a catalyst that acts as seed layer during subsequent electroless plating. The electrolessly plated material (e.g., copper) provides the low resistivity in the narrow lines of the grid needed for excellent performance of the capacitive touch sensor. Petcavich et. al. indicate that the line width of the flexographically printed material can be 1 to 50 microns.

To improve the optical quality and reliability of the touch screen, it has been found to be preferable that the width of the grid lines be approximately 3 to 10 microns, and even more preferably to be 4 to 8 microns. Printing such narrow lines stretches the limits of flexographic printing technology, especially when relatively high viscosity printing inks are used. What is needed is an inking system for a flexographic printing system that is capable of printing such narrow lines with high integrity and high yield using high viscosity printing inks.

SUMMARY OF THE INVENTION

The present invention represents a flexographic printing system comprising:
  a first print module for printing on a first side of a substrate, the first print module including:
    a first plate cylinder on which is mounted a first flexographic printing plate having raised features defining a first image to be printed on the first side of the substrate, the first plate cylinder rotating in a first direction of rotation;
    a first impression cylinder that is configured to force the first side of the substrate into contact with the first flexographic printing plate, the first impression cylinder rotating in a second direction of rotation opposite to the first direction of rotation;
    a first ink pan containing a first ink, the first ink pan including:
      a front wall disposed proximate to the first impression cylinder;
      a rear wall disposed distal to the first impression cylinder;
      a floor extending between the front wall and the rear wall; and
      first and second side walls that extend between the front wall and the rear wall and intersect the floor, the second side wall being opposite the first side wall;

a first anilox roller having a patterned surface for transferring a controlled amount of the first ink from the first ink pan to the first flexographic printing plate, the first anilox roller rotating in the second direction of rotation;

a first fountain roller that is at least partially immersed in the first ink in the first ink pan for transferring the first ink to the first anilox roller, the first fountain roller being mounted to the first ink pan and rotating in the first direction of rotation; and a first doctor blade for removing excess amounts of the first ink from the patterned surface of the first anilox roller before the first ink is transferred to the first flexographic printing plate, wherein the first doctor blade is mounted to the first ink pan and is on a side of the anilox roller proximate to the impression cylinder.

This invention has the advantage that it enables flexographic printing using viscous inks for print modules having tight spatial constraints around the anilox roller, particularly when printing on a side of the substrate requiring that the side of the anilox roller that faces the impression cylinder moves upward.

Embodiments where the doctor blade is pivotably attached to the ink pan using attachment features that are coaxial with a pivot axis of the ink pan provides the additional advantage that it enables better reproducible control of the contact angle and amount of deflection of the doctor blade at its contact point with the fountain roller.

Figure 1:
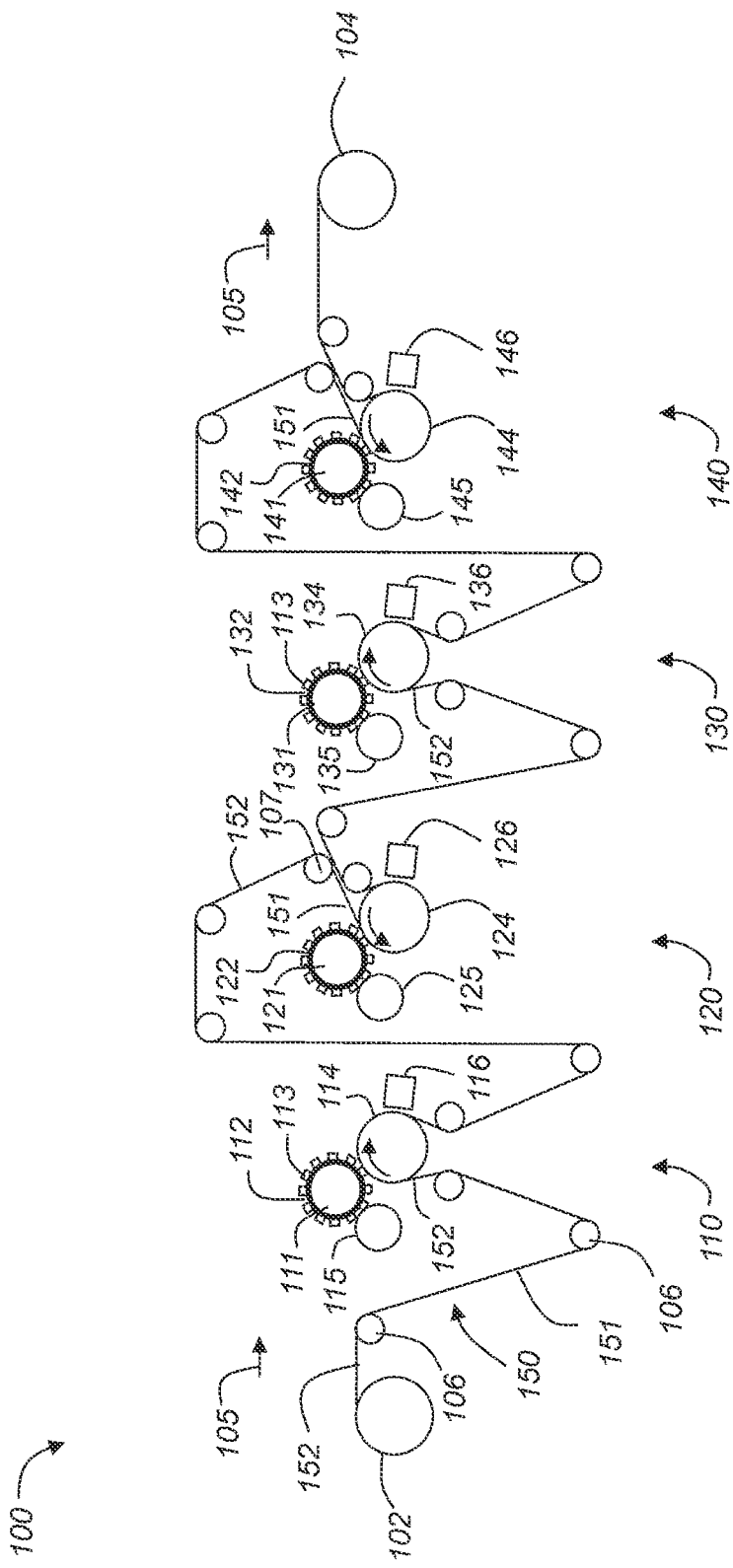
FIG. 1 is a schematic side view of a flexographic printing system for roll-to-roll printing on both sides of a substrate.

It is to be understood that the attached drawings are for purposes of illustrating the concepts of the invention and may not be to scale.

DETAILED DESCRIPTION OF THE INVENTION

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. It should be noted that, unless otherwise explicitly noted or required by context, the word "or" is used in this disclosure in a non-exclusive sense.

The example embodiments of the present invention are illustrated schematically and not to scale for the sake of clarity. One of ordinary skill in the art will be able to readily determine the specific size and interconnections of the elements of the example embodiments of the present invention.

As described herein, the example embodiments of the present invention provide an inking system for use in a flexographic printing system, particularly for printing functional devices incorporated into touch screens. However, many other applications are emerging for printing of functional devices that can be incorporated into other electronic, communications, industrial, household, packaging and product identification systems (such as RFID) in addition to touch screens. Furthermore, flexographic printing is conventionally used for printing of images and it is contemplated that the inking systems described herein can also be advantageous for such printing applications.

FIG. 1 is a schematic side view of a flexographic printing system 100 that can be used in embodiments of the invention for roll-to-roll printing on both sides of a substrate 150. Substrate 150 is fed as a web from supply roll 102 to take-up roll 104 through flexographic printing system 100. Substrate 150 has a first side 151 and a second side 152.

The flexographic printing system 100 includes two print modules 120 and 140 that are configured to print on the first side 151 of substrate 150, as well as two print modules 110 and 130 that are configured to print on the second side 152 of substrate 150. The web of substrate 150 travels overall in roll-to-roll direction 105 (left to right in the example of FIG. 1). However, various rollers 106 and 107 are used to locally change the direction of the web of substrate as needed for adjusting web tension, providing a buffer, and reversing a side for printing. In particular, note that in print module 120 roller 107 serves to reverse the local direction of the web of substrate 150 so that it is moving substantially in a right-to-left direction.

Each of the print modules 110, 120, 130, 140 include some similar components including a respective plate cylinder 111, 121, 131, 141, on which is mounted a respective flexographic printing plate 112, 122, 132, 142, respectively. Each flexographic printing plate 112, 122, 132, 142 has raised features 113 defining an image pattern to be printed on the substrate 150. Each print module 110, 120, 130, 140 also includes a respective impression cylinder 114, 124, 134, 144 that is configured to force a side of the substrate 150 into contact with the corresponding flexographic printing plate 112, 122, 132, 142.

More will be said below about rotation directions of the different components of the print modules 110, 120, 130, 140, but for now it is sufficient to note that the impression cylinders 124 and 144 of print modules 120 and 140 (for printing on first side 151 of substrate 150) rotate counter-clockwise in the view shown in FIG. 1, while the impression cylinders 114 and 134 of print modules 110 and 130 (for printing on second side 152 of substrate 150) rotate clockwise in this view.

Each print module 110, 120, 130, 140 also includes a respective anilox roller 115, 125, 135, 145 for providing ink to the corresponding flexographic printing plate 112, 122, 132, 142. As is well known in the printing industry, an anilox roller is a hard cylinder, usually constructed of a steel or aluminum core, having an outer surface containing millions of very fine dimples, known as cells. How the ink is controllably transferred and distributed onto the anilox roller is described below. In some embodiments, some or all of the print modules 110, 120, 130, 140 also include respective UV curing stations 116, 126, 136, 146 for curing the printed ink on substrate 150.

Figure 2:
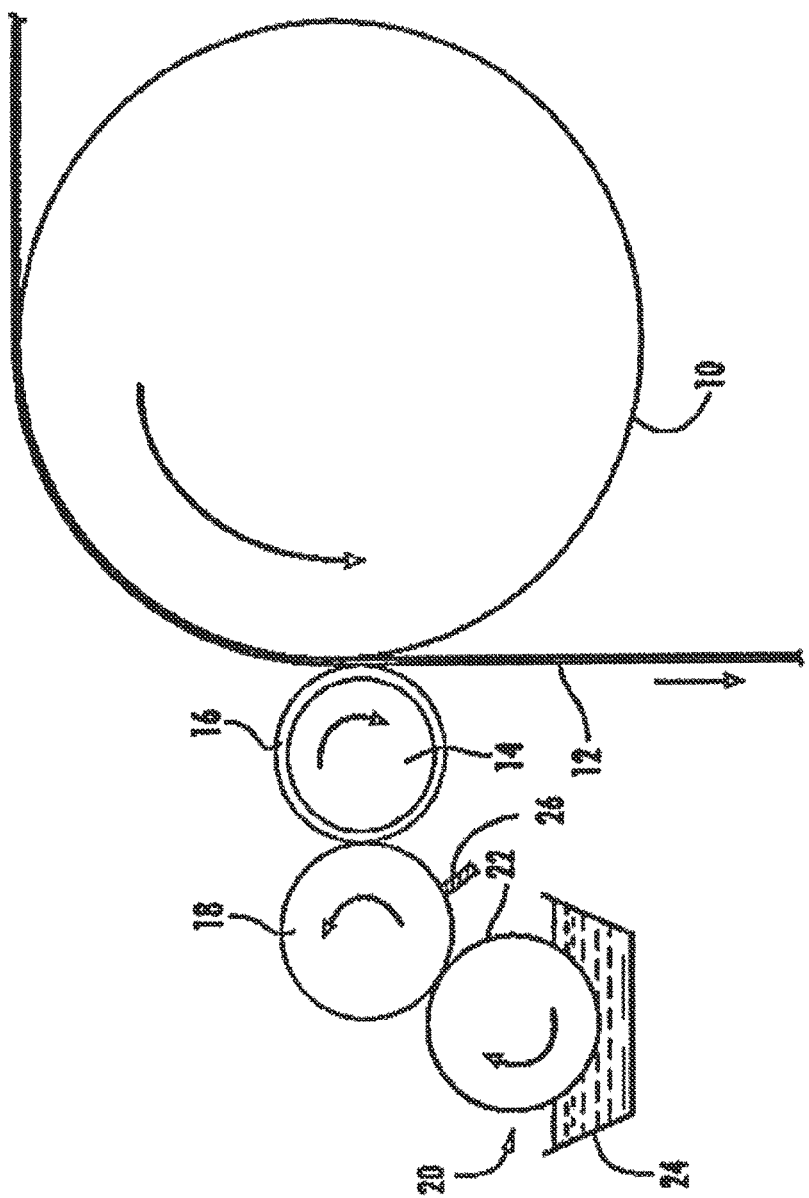
FIG. 2 is a prior art flexographic printing apparatus using a fountain roller for ink delivery.
Figure 3:
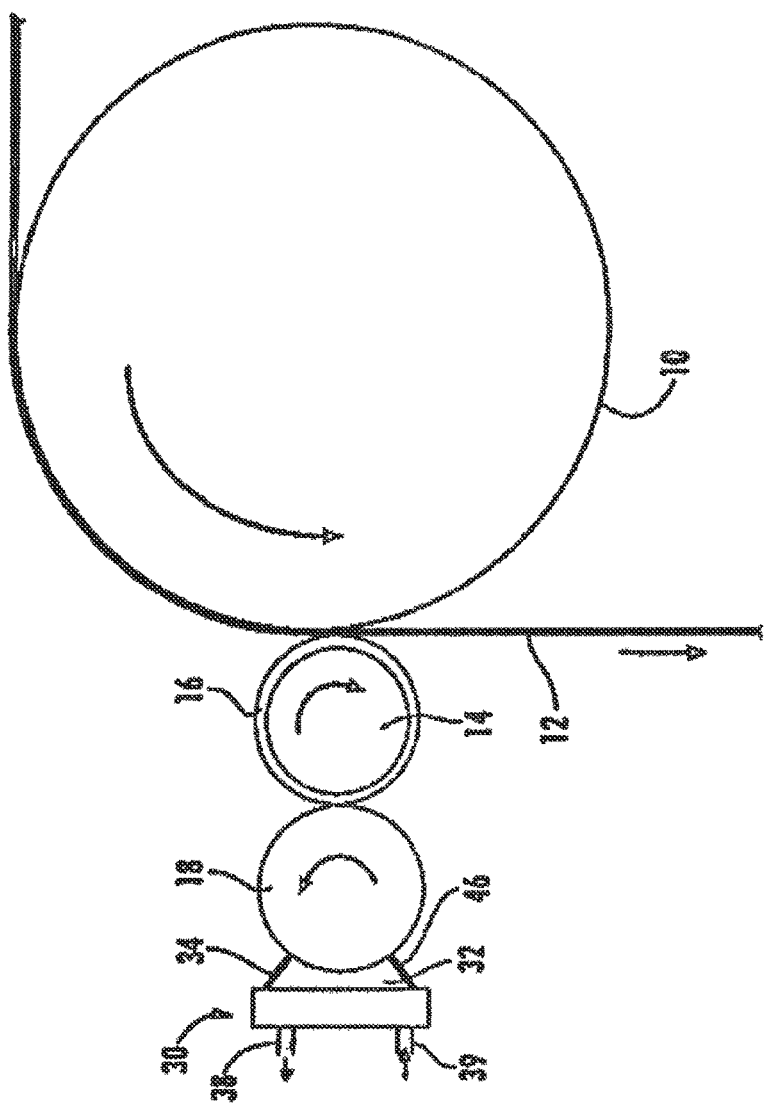
FIG. 3 is a prior art flexographic printing apparatus using a reservoir chamber for ink delivery.

U.S. Pat. No. 7,487,724 to Evans et. al. discloses inking systems for an anilox roller in a flexographic printing apparatus. FIG. 2 is a copy of Evans' FIG. 1 showing a flexographic printing apparatus using a fountain roller device 20 for delivering printing liquid (also called ink herein) to an anilox roller 18. FIG. 3 is a copy of Evans' FIG. 2 showing a reservoir chamber system 30 for delivering printing liquid to the anilox roller 18. The flexographic apparatuses shown in FIGS. 2 and 3 each comprises a rotatably driven impression cylinder 10 adapted to peripherally carry and transport a printable substrate 12, such as paper or a similar web-like material. A plate cylinder 14 is rotatably disposed adjacent the impression cylinder in axially parallel coextensive relation. The circumferential periphery of the plate cylinder 14 carries one or more flexible printing plates 16 formed with an image surface (not shown), for example in a relief image form, for peripherally contacting the circumferential surface of the impression cylinder 10 and the substrate 12 thereon. The anilox roller 18 is similarly disposed adjacent the plate cylinder 14 in axially parallel coextensive relation and in peripheral surface contact therewith.

The anilox roller 18 is has its circumferential surface engraved with a multitude of recessed cells, which may be of various geometric configurations, adapted collectively to retain a quantity of printing liquid in a continuous film-like form over the circumferential surface of the anilox roller 18 for metered transfer of the liquid to the image surface on the printing plate 16 of the plate cylinder 14.

The flexographic printing apparatuses of FIGS. 2 and 3 differ principally in construction and operation in the form of delivery device provided for applying printing liquid to the anilox roller 18. In the FIG. 2 apparatus, the delivery device is in the form of a so-called fountain roller device 20, wherein a cylindrical fountain roller 22 is disposed in axially parallel coextensive relation with the anilox roller 18 in peripheral surface contact therewith, with a downward facing lower portion of the fountain roller 22 being partially submerged in a pan 24 containing a quantity of printing liquid. The fountain roller 22 rotates and constantly keeps the engraved cell structure of the circumferential surface of the anilox roller 18 filled with the printing liquid, thereby forming a thin film of the liquid as determined by the size, number, volume and configuration of the cells. A doctor blade 26 is preferably positioned in angled surface contact with the anilox roller 18 downstream of the location of its contact with the fountain roller 22, as viewed in the direction of rotation of the anilox roller 18, to progressively wipe excess printing liquid from the surface of the anilox roller 18, which drains back into the pan 24.

In contrast, the flexographic printing apparatus shown in FIG. 3 does not utilize a fountain roller, but instead uses a reservoir chamber 32 positioned directly adjacent the anilox roller 18, with forwardly and rearwardly inclined blades 34, 46 disposed in axially extending wiping contact with the surface of the anilox roller 18 at a circumferential spacing from each other. Blade 34 is upstream of the contact of the printing liquid from reservoir chamber 32 with anilox roller 18, and serves as a containment blade. Blade 46 is downstream of the contact of the printing liquid from reservoir chamber 32 with anilox roller 18, and serves as a doctor blade to wipe excess printing liquid from the surface of the anilox roller 18. Printing liquid is continuously delivered into the reservoir chamber 32 at ink entry 39 and is exhausted from the reservoir chamber 32 at ink exit 38 so as to maintain a slightly positive fluid pressure within the reservoir chamber 32. In this manner, the reservoir chamber system 30 serves to constantly wet the peripheral surface of the anilox roller 18.

Figure 4B:
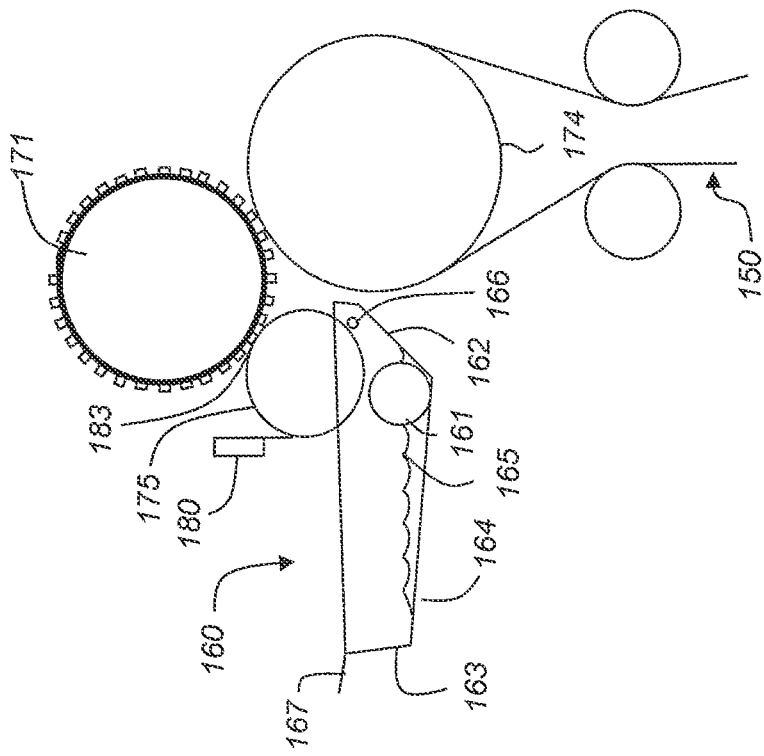
FIG. 4B shows the inking system of FIG. 4A with the pivotable ink pan pivoted downward so that the fountain roller is not in contact with the anilox roller.
Figure 4A:
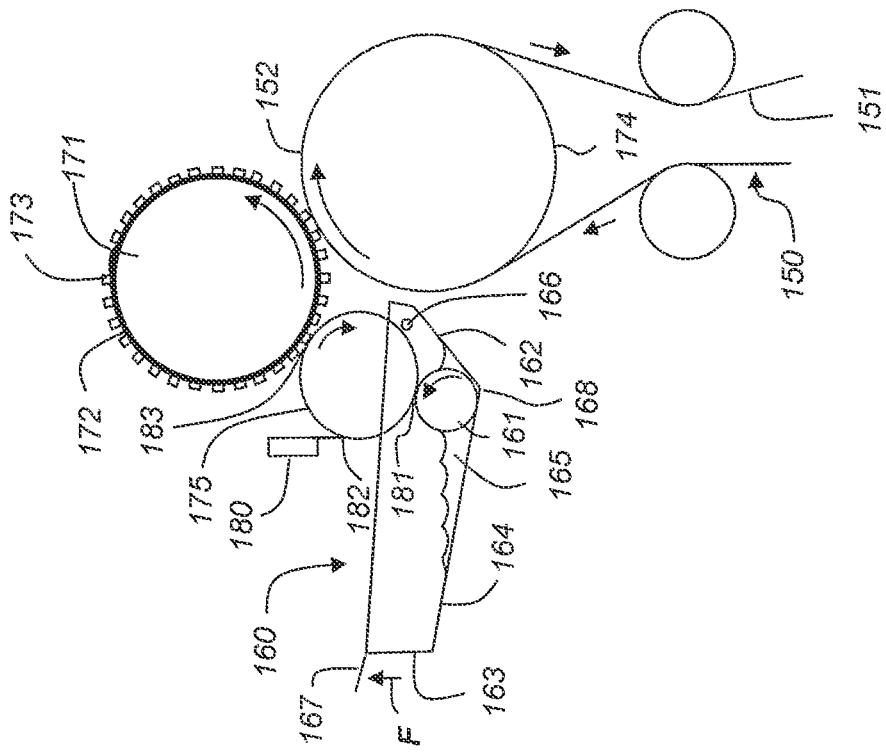
FIG. 4A is a schematic side view of an inking system using a pivotable ink pan with a fountain roller in contact with the anilox roller.

FIGS. 4A and 4B show a close-up side view of an exemplary embodiment of a pivoting ink pan 160 with fountain roller 161 for use in flexographic printing systems for providing ink to anilox roller 175. In this embodiment, the configuration and rotation directions of impression cylinder 174, plate cylinder 171 and anilox roller 175 are similar to the corresponding impression cylinder 114, plate cylinder 111 and anilox roller 115 in print module 110 of FIG. 1.

Pivoting ink pan 160 includes a front wall 162 located nearer to impression cylinder 114, a rear wall 163 located opposite front wall 162 and further away from impression cylinder 174, and a floor 164 extending between the front wall 162 and the rear wall 163. The ink pan 160 also includes two side walls (not shown in FIGS. 4A and 4B) that extend between the front wall 162 and the rear wall 163 on opposite sides of the ink pan 160 and intersect the floor 164. It should be noted that there may or may not be distinct boundaries between the front wall 162, the rear wall 163, the floor 164 and the side walls. In some embodiments, some or all of the boundaries between these surfaces can be joined using rounded boundaries that smoothly transition from one surface to the adjoining surface.

Fountain roller 161 is partially immersed in an ink 165 contained in ink pan 160. Within the context of the present invention, the ink 165 can be any type of marking material, visible or invisible, to be deposited by the flexographic printing system 100 (FIG. 1) on the substrate 150. Fountain roller 161 is rotatably mounted on ink pan 160. Ink pan 160 is pivotable about pivot axis 166, preferably located near the front wall 162.

A lip 167 extends from rear wall 163. When an upward force F is applied to lip 167 as in FIG. 4A, ink pan 160 pivots upward about pivot axis 166 until fountain roller 161 contacts anilox roller 175 at contact point 181. In the upwardly pivoted ink pan 160, the floor 164 tilts downward from rear wall 163 toward the front wall 162 so that fountain roller 161 is located near a lowest portion 168 of floor 164. If upward force F is removed from lip 167 as in FIG. 4B, ink pan 160 pivots downward under the influence of gravity so that fountain roller 161 is no longer in contact with anilox roller 175.

As described with reference to FIG. 1, a flexographic printing plate 172 (also sometimes called a flexographic master) is mounted on plate cylinder 171. In FIG. 4A, flexographic printing plate 172 is a flexible plate that is wrapped almost entirely around plate cylinder 171. Anilox roller 175 contacts raised features 173 on the flexographic printing plate 172 at contact point 183. As plate cylinder 171 rotates counter-clockwise (in the view shown in FIG. 4A), both the anilox roller 175 and the impression cylinder 174 rotate clockwise, while the fountain roller 161 rotates counter-clockwise. Ink 165 that is transferred from the fountain roller 161 to the anilox roller 175 is transferred to the raised features 173 of the flexographic printing plate 172 and from there to second side 152 of substrate 150 that is pressed against flexographic printing plate 172 by impression cylinder 174.

In order to remove excess amounts of ink 165 from the patterned surface of anilox roller 175 a doctor blade 180, which is mounted to the frame (not shown) of the printing system, contacts anilox roller 175 at contact point 182. Contact point 182 is downstream of contact point 181 and is upstream of contact point 183. For the configuration shown in FIG. 4A, in order to position doctor blade 180 to contact the anilox roller 175 downstream of contact point 181 where the fountain roller 161 contacts the anilox roller 175, as well as upstream of contact point 183 where the anilox roller 175 contacts the raised features 173 on the flexographic printing plate 172, doctor blade 180 is mounted on the printer system frame on a side of the anilox roller 175 that is opposite to the impression cylinder 174.

The configuration of the pivotable ink pan 160 with the doctor blade 180 located on the side of the anilox roller 175 that is opposite to the impression cylinder 174, as shown in FIGS. 4A and 4B, is compatible for the rotation directions of the rollers that are as shown in print modules 110 and 130 of FIG. 1 for printing on second side 152 of substrate 150. In such configurations (with reference to FIG. 4A), the side of anilox roller 175 that moves upward toward plate cylinder 171 after receiving ink 165 from fountain roller 161 is the side that is located farther away from the front wall 162 of ink pan 160, and also farther away from impression cylinder 174. Comparing FIG. 1 with FIG. 4A it can be appreciated that for print modules 120 and 140, where the rotation directions of the impression cylinders 124 and 144 is opposite the rotation directions of the impression cylinders 114 and 134 in print modules 110 and 130, the side of the corresponding anilox rollers 125 and 145 that would move upward from the ink pans 160 (not shown in FIG. 1) toward the plate cylinders 121 and 141 would be the side that is next to the front wall 162 of ink pan 160. In some flexographic printing systems, spatial constraints due to the proximity of the impression cylinder 174 to the near side of the anilox roller 175 limit where a doctor blade could be positioned on that side of the anilox roller 175. (By contrast, the more spread-out prior art configuration shown in FIG. 2 does not have such spatial constraints, so that the doctor blade 26 can be located on that side of anilox roller 18.)

Figure 5:
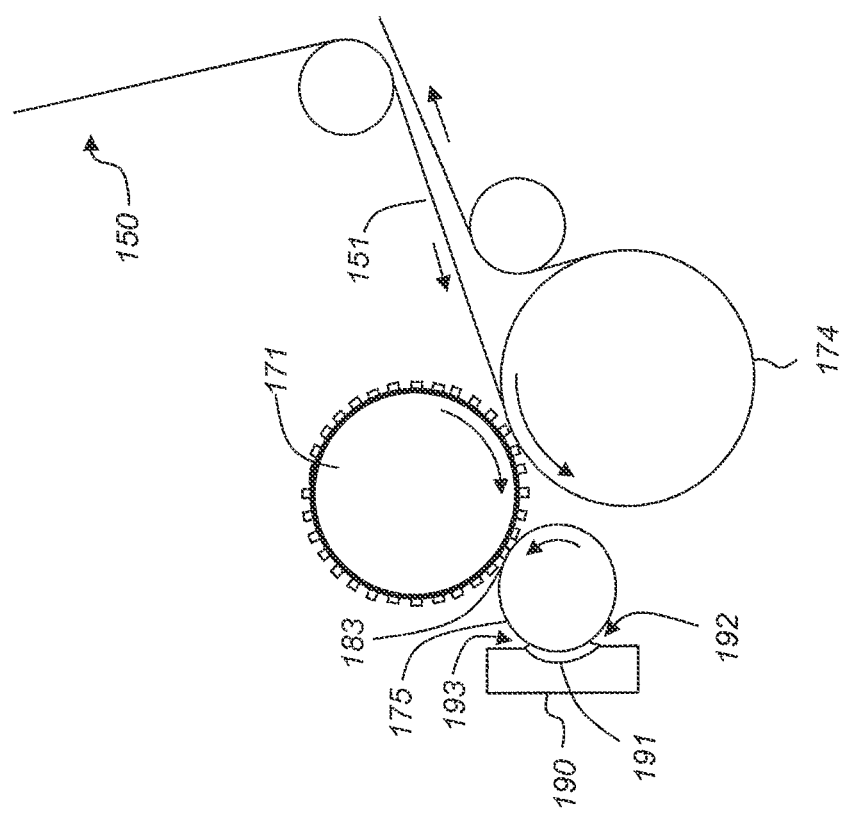
FIG. 5 is a schematic side view of an inking system using an ink chamber for ink delivery.

One approach to addressing the spatial constraints described above, which is used in some flexographic printing systems, is to use an ink chamber 190 for ink delivery as shown in FIG. 5 (similar to reservoir chamber 32 shown in prior art FIG. 3). An ink delivery portion 191 directly transfers ink to the surface of anilox roller 175 without the use of an ink pan 160 or fountain roller 161 (FIG. 4A). Downstream of the ink delivery portion 191 (for the rotation direction shown for the anilox roller 175 of FIG. 5), a doctor blade 192 removes excess ink from the surface of the anilox roller. A containment blade 193 is located at the opposite end of the ink delivery portion 191 to keep the ink in contact with the surface of the anilox roller 175 without spilling.

The configuration shown in FIG. 5 is well suited for many flexographic printing applications for configurations such as those of print modules 120 and 140 in FIG. 1 where the web of substrate 150 reverses direction for printing on first side 151. However, it has recently been found that for printing of narrow lines with somewhat viscous inks (e.g., 300 centipoises to 3000 centipoises), the line quality is better for lines printed on second side 152 of substrate 150 using an ink pan 160 and fountain roller 161 configuration for application of ink to the anilox roller 175 (FIG. 4A) than for lines printed on first side 151 of the substrate 150 using an ink chamber 190 to deliver ink directly to the anilox roller 175 (FIG. 5). It is believed that the fountain roller 161 (FIG. 4A) is more effective at forcing viscous inks into the cells on the surface of the anilox roller 175 than is mere contact of ink at the ink delivery portion 191 of an ink chamber 190 (FIG. 5).

Figure 6:
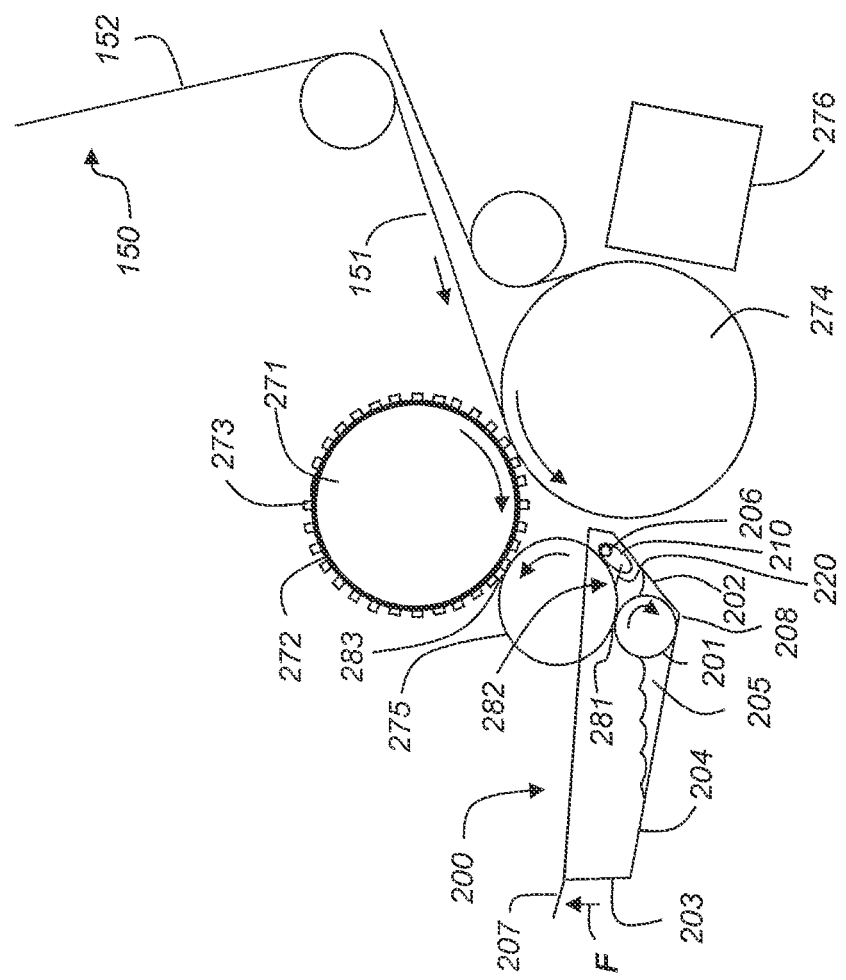
FIG. 6 is a schematic side view of an embodiment of the invention where the doctor blade is mounted to the ink pan.

Embodiments of the present invention address the problem of flexographic printing using viscous inks for print modules having tight spatial constraints around the anilox roller when printing on a side of the substrate requiring that the side of the anilox roller that faces the impression cylinder moves upward. A close-up schematic side view of one embodiment is shown in FIG. 6. Like FIG. 5, the configuration shown in FIG. 6 can be used, for example, for print modules 120 and 140 in FIG. 1 where the web of substrate 150 reverses direction for printing on first side 151, such that a direction of rotation of impression cylinder 274 causes a surface of the impression cylinder 274 to move in a downward direction on a side of the impression cylinder 274 facing front wall 202 of ink pan 200. In the embodiment of FIG. 6, pivotable ink pan 200 with fountain roller 201 positioned in proximity to lowest portion 208 of ink pan 200 is used to transfer ink 205 to anilox roller 275 at contact point 281. Ink 205 is transferred to raised features 273 of flexographic printing plate 272 on plate cylinder 271 at contact point 283 and is subsequently printed onto first side 151 of substrate 150, being pressed into contact by impression cylinder 274. As in FIG. 4A, a force F can be applied to lip 207 of the ink pan 200 to pivot the ink pan 200 around the pivot axis 206, bringing the fountain roller 201 into contact with the anilox roller 275. UV curing station 276 is optionally provided for curing the printed ink on first side 151 of substrate 150.

Fitting doctor blade 220 within the tight spatial constraints downstream of contact point 281 and upstream of contact point 283 (where anilox roller 275 transfers ink 205 to raised features 273 of flexographic printing plate 272) is addressed by mounting the doctor blade 220 to the ink pan 200 on the side of the anilox roller 275 that is nearest to the impression cylinder 274. In particular, doctor blade 220 can be mounted within ink pan 200 using a blade holder 210 positioned near the front wall 202 of the ink pan 200. Doctor blade 220 contacts anilox roller 275 at contact point 282 proximate the contact point 281 between the fountain roller 201 and anilox roller 275. By "proximate the contact point 281" here it is meant that a circumferential arc between contact point 281 and contact point 282 of doctor blade 220 with anilox roller subtends an angle α (see FIG. 8) of 45 degrees or less.

Figure 7:
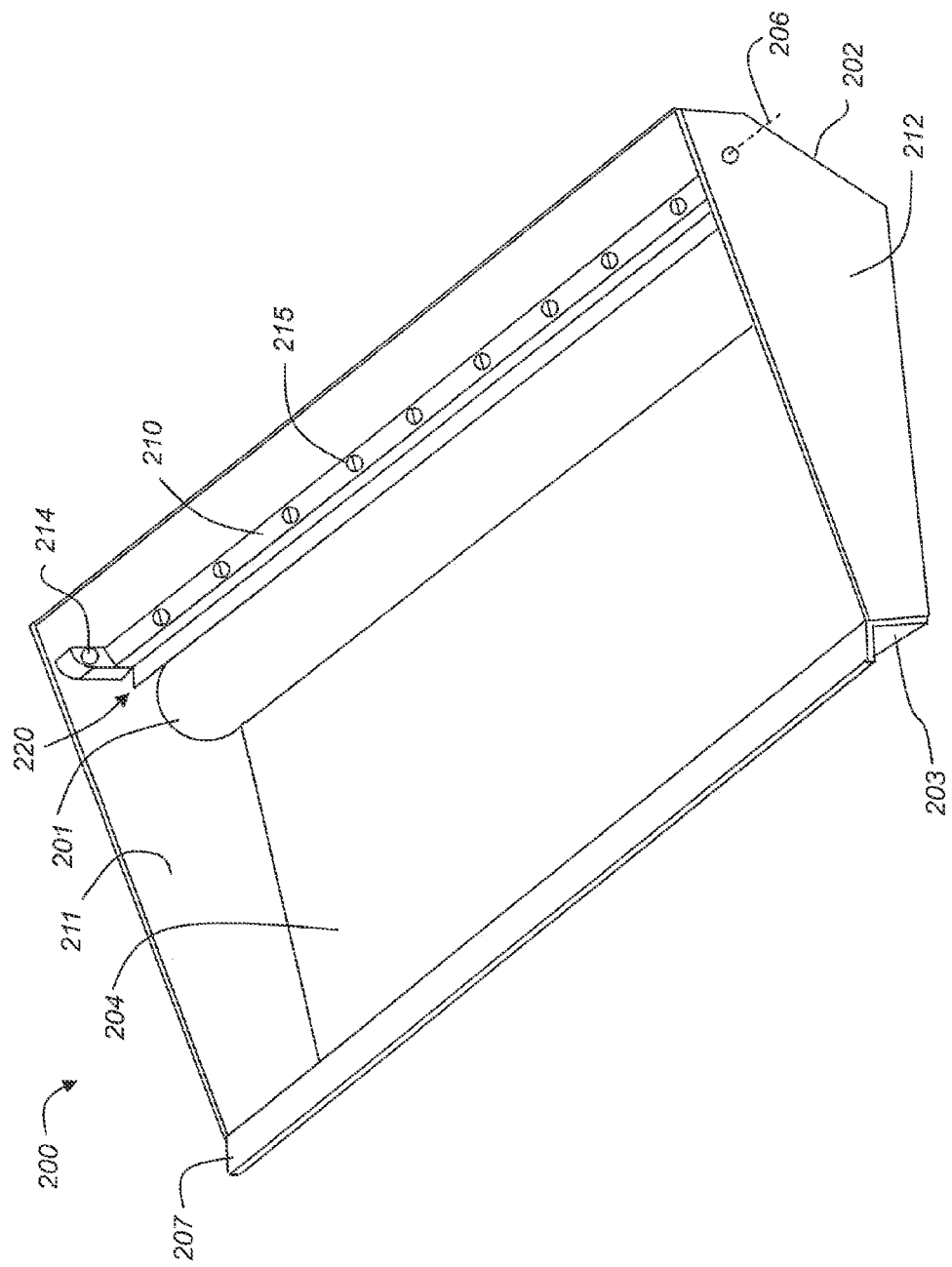
FIG. 7 is a top perspective of the ink pan of FIG. 6.

FIG. 7 shows a top perspective of ink pan 200 without ink. First side wall 211 and its opposing second side wall 212 are shown in this perspective as extending between the front wall 202 and the rear wall 203 and intersecting the floor 204. Doctor blade 220 is mounted to ink pan 200 using blade holder 210 that is affixed by one or more attachment features 214 to ink pan 200. In particular, one attachment feature 214 is shown as being affixed to the first side wall 211. An analogous second attachment feature 214 is hidden in this perspective, but is affixed to the second side wall 212. Inventors have found that it is particularly advantageous if blade holder 210 is pivotably attached to ink pan 200 using attachment features 214 that are coaxial with the pivot axis 206 of ink pan 200 for moving fountain roller 201 into and out of contact with anilox roller 275. Such an attachment arrangement enables better reproducible control of the contact point 282 between the doctor blade 220 and the anilox roller 275, as well as the contact angle and amount of deflection of doctor blade 220 at contact point 282. The doctor blade 220 is clamped between upper and lower portions (not shown) of blade holder 210 by blade holding screws 215.

Figure 8:
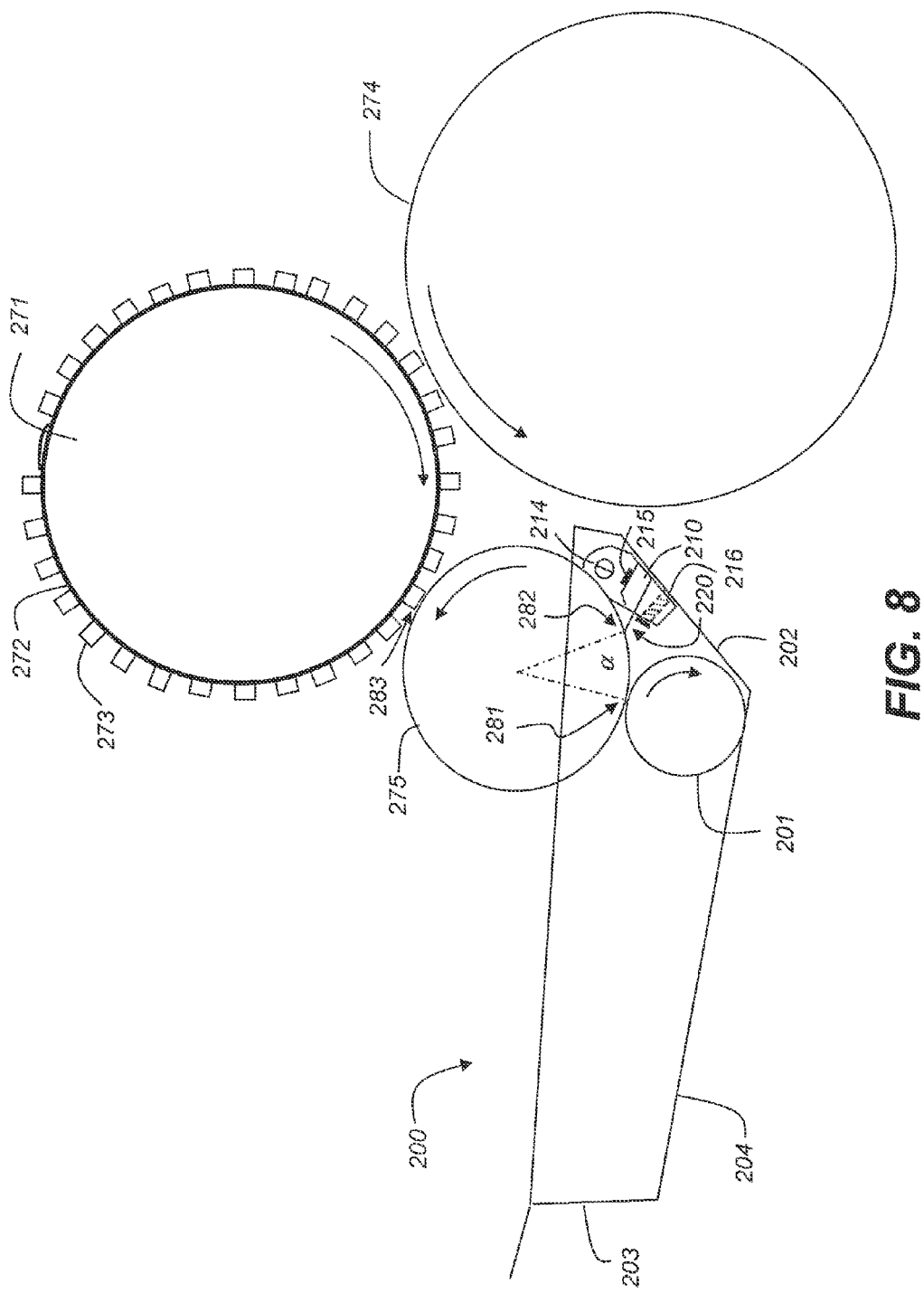
FIG. 8 is a magnified schematic side view of the inking system of FIG. 6.

FIG. 8 shows a schematic side view of ink pan 200 without ink. In the illustrated embodiment one or more adjustment screws 216 are provided as adjustment features for doctor blade 220 by setting an amount of pivoting of the pivotable blade holder 210 about attachment features 214 in order to control a force of engagement of doctor blade 220 with anilox roller 275. As shown, adjustment screw 216 has an end (not labeled) that is contactable with the front wall 202 of the ink pan 200.

In some embodiments, flexographic printing systems 100 (FIG. 1) include first print modules for printing on the first side 151 of the web of substrate 150, and second print modules for printing on second side 152 of the web of substrate 150. Herein the terms first print module and second print module do not imply their respective order within the flexographic printing system 100. Rather, with reference also to FIGS. 6-8, the first print module refers to a print module such as print modules 120 and 140 (FIG. 1) where the web of substrate 150 reverses direction for printing on the first side 151, such that a direction of rotation of the impression cylinder 274 causes a surface of the first impression cylinder 274 to move in a downward direction on a side of the first impression cylinder 274 facing the front wall 202 of the ink pan 200. With reference to FIG. 4A, the second print module refers to a print module such as print modules 110 and 130 (FIG. 1) where the web of substrate 150 moves in a direction for printing on second side 152, such that a direction of rotation of the impression cylinder 174 causes a surface of the impression cylinder 174 to move in an upward direction on a side of the impression cylinder 174 facing the front wall 162 of the ink pan 160.

Figure 9:
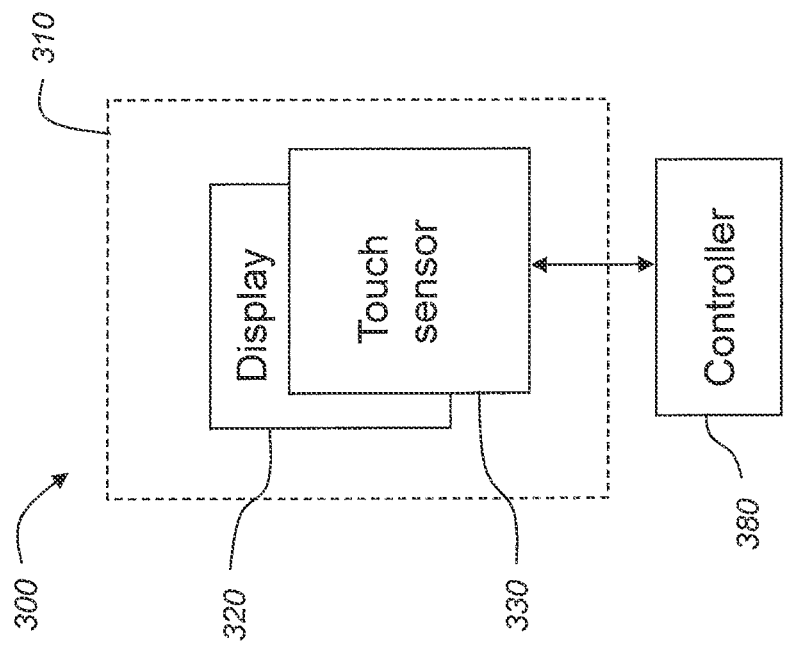
FIG. 9 is a high-level system diagram for an apparatus having a touch screen with a touch sensor that can be printed using embodiments of the invention.

FIG. 9 shows a high-level system diagram for an apparatus 300 having a touch screen 310 including a display device 320 and a touch sensor 330 that overlays at least a portion of a viewable area of display device 320. Touch sensor 330 senses touch and conveys electrical signals (related to capacitance values for example) corresponding to the sensed touch to a controller 380. Touch sensor 330 is an example of an article that can be printed on both sides by the flexographic printing system 100 including print modules that incorporate embodiments of inking systems described above.

Figure 10:
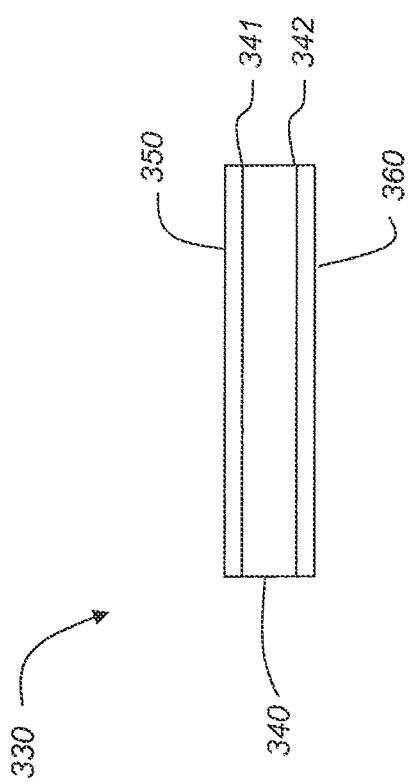
FIG. 10 is a side view of the touch sensor of FIG. 9.

FIG. 10 shows a schematic side view of a touch sensor 330. Transparent substrate 340, for example polyethylene terephthalate, has a first conductive pattern 350 printed on a first side 341, and a second conductive pattern 360 printed on a second side 342. The length and width of the transparent substrate 340, which is cut from the take-up roll 104 (FIG. 1), is not larger than the flexographic printing plates 112, 122, 132, 142 of flexographic printing system 100 (FIG. 1), but it could be smaller than the flexographic printing plates 112, 122, 132, 142. Optionally, the first conductive pattern 350 and the second conductive pattern 360 can be plated using a plating process for improved electrical conductivity after flexographic printing and curing of the patterns.

Figure 11:
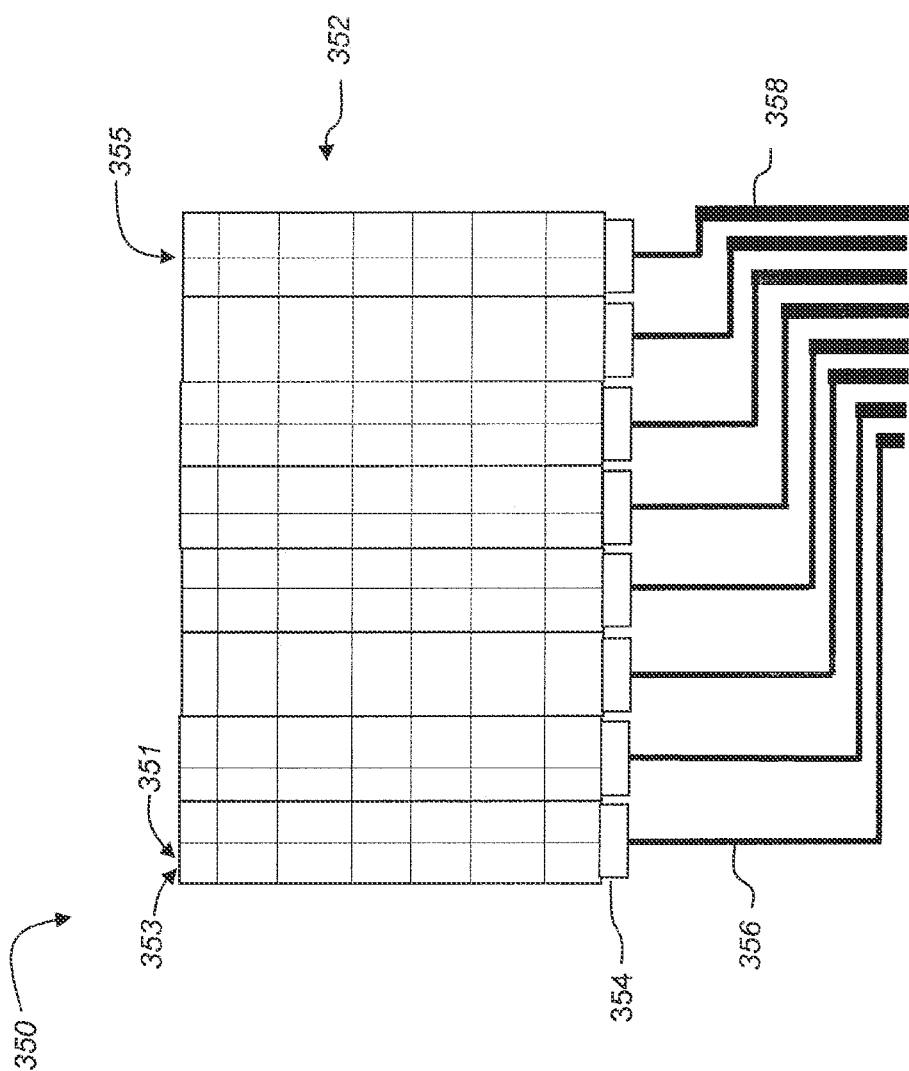
FIG. 11 is a top view of a conductive pattern printed on a first side of the touch sensor of FIG. 10.

FIG. 11 shows an example of a conductive pattern 350 that can be printed on first side 341 (FIG. 10) of substrate 340 (FIG. 10) using one or more print modules such as print modules 120 and 140 of flexographic printing system (FIG. 1). Conductive pattern 350 includes a grid 352 including grid columns 355 of intersecting fine lines 351 and 353 that are connected to an array of channel pads 354. Interconnect lines 356 connect the channel pads 354 to the connector pads 358 that are connected to controller 380 (FIG. 9). Conductive pattern 350 can be printed by a single print module 120 in some embodiments. However, because the optimal print conditions for fine lines 351 and 353 (e.g., having line widths on the order of 4 to 8 microns) are typically different than for printing the wider channel pads 354, connector pads 358 and interconnect lines 356, it can be advantageous to use one print module 120 for printing the fine lines 351 and 353 and a second print module 140 for printing the wider features. Furthermore, for clean intersections of fine lines 351 and 353, it can be further advantageous to print and cure one set of fine lines 351 using one print module 120, and to print and cure the second set of fine lines 353 using a second print module 140, and to print the wider features using a third print module (not shown in FIG. 1) configured similarly to print modules 120 and 140.

Figure 12:
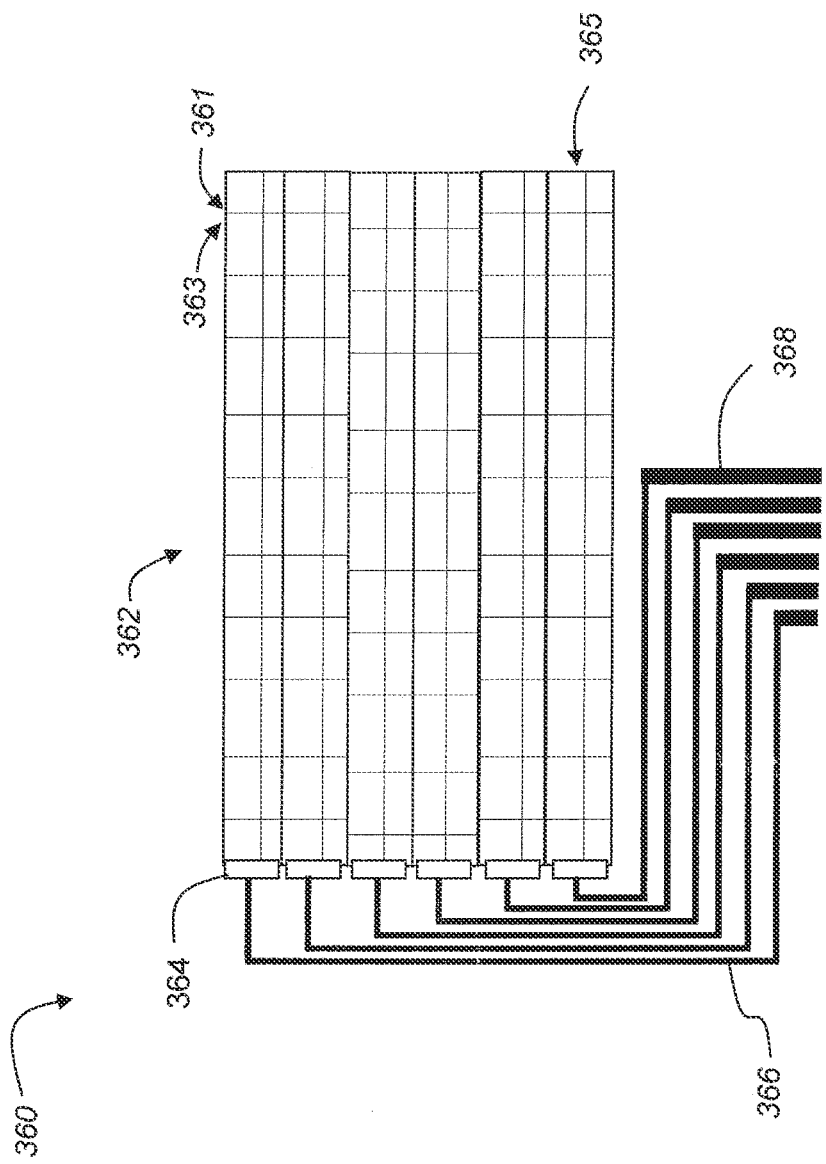
FIG. 12 is a top view of a conductive pattern printed on a second side of the touch sensor of FIG. 10

FIG. 12 shows an example of a conductive pattern 360 that can be printed on second side 342 (FIG. 10) of substrate 340 (FIG. 10) using one or more print modules such as print modules 110 and 130 of flexographic printing system (FIG. 1). Conductive pattern 360 includes a grid 362 including grid rows 365 of intersecting fine lines 361 and 363 that are connected to an array of channel pads 364. Interconnect lines 366 connect the channel pads 364 to the connector pads 368 that are connected to controller 380 (FIG. 9). In some embodiments, conductive pattern 360 can be printed by a single print module 110. However, because the optimal print conditions for fine lines 361 and 363 (e.g., having line widths on the order of 4 to 8 microns) are typically different than for the wider channel pads 364, connector pads 368 and interconnect lines 366, it can be advantageous to use one print module 110 for printing the fine lines 361 and 363 and a second print module 130 for printing the wider features. Furthermore, for clean intersections of fine lines 361 and 363, it can be further advantageous to print and cure one set of fine lines 361 using one print module 110, and to print and cure the second set of fine lines 363 using a second print module 130, and to print the wider features using a third print module (not shown in FIG. 1) configured similarly to print modules 110 and 130.

Alternatively in some embodiments conductive pattern 350 can be printed using one or more print modules configured like print modules 110 and 130, and conductive pattern 360 can be printed using one or more print modules configured like print modules 120 and 140 of FIG. 1.

With reference to FIGS. 9-12, in operation of touch screen 310, controller 380 can sequentially electrically drive grid columns 355 via connector pads 358 and can sequentially sense electrical signals on grid rows 365 via connector pads 368. In other embodiments, the driving and sensing roles of the grid columns 355 and the grid rows 365 can be reversed.

The invention has been described in detail with particular reference to certain preferred embodiments thereof, but it will be understood that variations and modifications can be effected within the spirit and scope of the invention.

PARTS LIST 10 impression cylinder
12 substrate
14 plate cylinder
16 printing plate
18 anilox roller
20 fountain roller device
22 fountain roller
24 pan
26 doctor blade
30 reservoir chamber system
32 reservoir chamber 34 blade
38 ink exit
39 ink entry
46 blade
100 flexographic printing system
102 supply roll
104 take-up roll
105 roll-to-roll direction
106 roller
107 roller
110 print module
111 plate cylinder
112 flexographic printing plate
113 raised features
114 impression cylinder
115 anilox roller
116 UV curing station
120 print module
121 plate cylinder
122 flexographic printing plate
124 impression cylinder
125 anilox roller
126 UV curing station
130 print module
131 plate cylinder
132 flexographic printing plate
134 impression cylinder
135 anilox roller
136 UV curing station
140 print module
141 plate cylinder
142 flexographic printing plate
144 impression cylinder
145 anilox roller
146 UV curing station
150 substrate
151 first side
152 second side
160 ink pan
161 fountain roller
162 front wall
163 rear wall
164 floor
165 ink
166 pivot axis
167 lip
168 lowest portion
171 plate cylinder
172 flexographic printing plate
173 raised features
174 impression cylinder
175 anilox roller
180 doctor blade
181 contact point
182 contact point
183 contact point
190 ink chamber
191 ink delivery portion
192 doctor blade
193 containment blade
200 ink pan
201 fountain roller
202 front wall
203 rear wall
204 floor
205 ink
206 pivot axis
207 lip
208 lowest portion
210 blade holder
211 first side wall
212 second side wall
214 attachment feature
215 blade holding screw
216 adjustment screw
220 doctor blade
271 plate cylinder
272 flexographic printing plate
273 raised features
274 impression cylinder
275 anilox roller
276 UV curing station
281 contact point
282 contact point
283 contact point
300 apparatus
310 touch screen
320 display device
330 touch sensor
340 transparent substrate
341 first side
342 second side
350 conductive pattern
351 fine lines
352 grid
353 fine lines
354 channel pads
355 grid column
356 interconnect lines
358 connector pads
360 conductive pattern
361 fine lines
362 grid
363 fine lines
364 channel pads
365 grid row
366 interconnect lines
368 connector pads
380 controller
F force

The invention claimed is:
1. A flexographic printing system comprising:
a first print module for printing on a first side of a substrate, the first print module including:
a first plate cylinder on which is mounted a first flexographic printing plate having raised features defining a first image to be printed on the first side of the substrate, the first plate cylinder rotating in a first direction of rotation;
a first impression cylinder that is configured to force the first side of the substrate into contact with the first flexographic printing plate, the first impression cylinder rotating in a second direction of rotation opposite to the first direction of rotation;
a first ink pan containing a first ink, the first ink pan including:
a front wall disposed proximate to the first impression cylinder;
a rear wall disposed distal to the first impression cylinder;
a floor extending between the front wall and the rear wall; and first and second side walls that extend between the front wall and the rear wall and intersect the floor, the second side wall being opposite the first side wall;

a first anilox roller having a patterned surface for transferring a controlled amount of the first ink from the first ink pan to the first flexographic printing plate, the first anilox roller rotating in the second direction of rotation;

a first fountain roller that is at least partially immersed in the first ink in the first ink pan for transferring the first ink to the first anilox roller, the first fountain roller being mounted to the first ink pan and rotating in the first direction of rotation; and a first doctor blade for removing excess amounts of the first ink from the patterned surface of the first anilox roller before the first ink is transferred to the first flexographic printing plate, wherein the first doctor blade is mounted to the first ink pan and wherein a contact point between the first doctor blade and the anilox roller is located on a side of the anilox roller that is nearest to the impression cylinder;

wherein the first ink pan is pivotable about a pivot axis in order to move the first fountain roller into and out of contact with the first anilox roller, and wherein the first doctor blade is pivotably attached to the first ink pan using a pivotable blade holder that is affixed by one or more attachment features to the first ink roan such that the pivotable blade holder pivots coaxially with the pivot axis of the first ink pan.

2. The flexographic printing system of claim 1, wherein the first ink pan tilts, and wherein the first fountain roller is disposed proximate to a lowest portion of the floor of the first ink pan.

3. The flexographic printing system of claim 1, the attachment features include:
   a first attachment feature that is affixed to the first side wall; and
   a second attachment feature that is affixed to the second side wall.

4. The flexographic printing system of claim 1, further including a doctor blade adjustment feature configured to set an amount of pivoting of the pivotable blade holder in order to control a force of engagement of the first doctor blade with the first anilox roller.

5. The flexographic printing system of claim 1, wherein the first doctor blade contacts the first anilox roller proximate a point of contact between the first fountain roller and the first anilox roller.

6. The flexographic printing system of claim 1, wherein the first ink has a viscosity between 300 centipoises and 3000 centipoises.

7. The flexographic printing system of claim 1, further including a first UV curing station for curing the first ink on the first side of the substrate.

8. The flexographic printing system of claim 1, wherein the rotation of the first impression cylinder in the first direction of rotation causes a surface of the first impression cylinder to move in a downward direction on a side of the first impression cylinder facing the front wall of the first ink pan.

9. The flexographic printing system of claim 1, further including:
   a second print module for printing on a second side of a substrate, the second print module including:
   a second plate cylinder on which is mounted a second flexographic printing plate having raised features defining a second image to be printed on the second side of the substrate, the second plate cylinder rotating in the second direction of rotation;
   a second impression cylinder that is configured to force the second side of the substrate into contact with the second flexographic printing plate, the second impression cylinder rotating in the first direction of rotation;
   a second ink pan containing a second ink, the second ink pan including:
      a front wall disposed proximate to the second impression cylinder;
      a rear wall disposed distal to the second impression cylinder;
      a floor extending between the front wall and the rear wall; and
      first and second side walls that extend between the front wall and the rear wall and intersect the floor, the second side wall being opposite the first side wall;
   a second anilox roller having a patterned surface for transferring a controlled amount of the second ink from the second ink pan to the second flexographic printing plate, the second anilox roller rotating in the first direction of rotation;
   a second fountain roller that is at least partially immersed in the second ink in the second ink pan for transferring the second ink to the second anilox roller, the second fountain roller being mounted to the second ink pan and rotating in the second direction of rotation; and
   a second doctor blade for removing excess amounts of the second ink from the patterned surface of the second anilox roller before the second ink is transferred to the second flexographic printing plate, wherein the second doctor blade is on a side of the anilox roller opposite to the impression cylinder.

10. The flexographic printing system of claim 9, further comprising a third print module for printing on the first side of the substrate, wherein the third print module has a same configuration as the first print module.

11. The flexographic printing system of claim 10, further comprising a fourth print module for printing on the second side of the substrate, wherein the fourth print module has a same configuration as the second print module.

12. A flexographic printing system comprising:
   a first print module for printing on a first side of a substrate, the first print module including:
   a first plate cylinder on which is mounted a first flexographic printing plate having raised features defining a first image to be printed on the first side of the substrate, the first plate cylinder rotating in a first direction of rotation;
   a first impression cylinder that is configured to force the first side of the substrate into contact with the first flexographic printing plate, the first impression cylinder rotating in a second direction of rotation opposite to the first direction of rotation;
   a first ink pan containing a first ink, the first ink pan including:
      a front wall disposed proximate to the first impression cylinder;
      a rear wall disposed distal to the first impression cylinder;
      a floor extending between the front wall and the rear wall; and
      first and second side walls that extend between the front wall and the rear wall and intersect the floor, the second side wall being opposite the first side wall;
   a first anilox roller having a patterned surface for transferring a controlled amount of the first ink from the first ink pan to the first flexographic printing plate, the first anilox roller rotating in the second direction of rotation;

a first fountain roller that is at least partially immersed in the first ink in the first ink pan for transferring the first ink to the first anilox roller, the first fountain roller being mounted to the first ink pan and rotating in the first direction of rotation, wherein the first ink pan is pivotable about a pivot axis in order to move the first fountain roller into and out of contact with the first anilox roller;

a first doctor blade for removing excess amounts of the first ink from the patterned surface of the first anilox roller before the first ink is transferred to the first flexographic printing plate, wherein the first doctor blade is mounted to the first ink pan and is on a side of the anilox roller proximate to the impression cylinder using a pivotable blade holder that is attached by one or more attachment features to the first ink pan such that the pivotable blade holder pivots coaxially with the pivot axis of the first ink pan; and a doctor blade adjustment feature configured to set an amount of pivoting of the pivotable blade holder in order to control a force of engagement of the first doctor blade with the first anilox roller, wherein the doctor blade adjustment feature includes an adjustment screw having an end that is contactable with the front wall of the first ink pan.

* * * * *